United States Patent [19]

Cline

[11] Patent Number: 5,087,837

[45] Date of Patent: Feb. 11, 1992

[54] ELECTRONIC CIRCUIT WITH CAPACITIVELY ENHANCED SWITCHING

[75] Inventor: Ronald L. Cline, Monte Sereno, Calif.

[73] Assignee: North American Philips Corp., Signetics Div., Sunnyvale, Calif.

[21] Appl. No.: 563,021

[22] Filed: Aug. 6, 1990

[51] Int. Cl.[5] .................... H03K 19/086; H03K 5/12; H03K 3/01; G06G 7/12
[52] U.S. Cl. .................................... 307/455; 307/494; 307/263; 307/270; 307/443
[58] Field of Search ............... 307/494, 497, 455, 350, 307/364, 264, 263, 270, 443

[56] References Cited

U.S. PATENT DOCUMENTS

| | | | |
|---|---|---|---|
| 4,539,493 | 9/1985 | Varadarajan | 307/455 |
| 4,642,482 | 2/1987 | Kasperkovitz et al. | 307/494 |
| 4,678,942 | 7/1987 | Kanai et al. | 307/455 |
| 4,680,480 | 7/1987 | Hopta | 307/270 |
| 4,920,284 | 4/1990 | Denda | 307/494 |

OTHER PUBLICATIONS

Toh et al., "A 23 ps/2.1 mW ECL Gate", 1989 IEEE Int'l. Solid-State Cirs. Conf., Dig. Tech. Paps., 17 Feb. 1989, pp. 224-225.
Coy et al., "A 13,000 Gate 3 Layer Metal Bipolar Gate Array", Procs. IEEE 1988 Custom ICs Conf., 16-19 May 1988, pp. 20.1.1-20.1.3.
Ostaszewski et al., "Sea-of-Cells, ECL Arrays Come of Age", VLSI System Design, Nov. 1988, pp. 18-19, 22, 24, 28 and 32.

Primary Examiner—Stanley D. Miller
Assistant Examiner—Trong Phan
Attorney, Agent, or Firm—A. Tamoshunas; J. Haken; R. Meetin

[57] ABSTRACT

A circuit formed with an input stage (20) and an output stage (22 or 28) uses capacitively enhanced switching to improve switching speed without significantly raising steady-state current utilization. The output stage contains a pair of amplifiers (A1 and A2) that respond to complementary signals ($V_{M1}$ and $V_{M2}$) produced by the input stage. The amplifiers are coupled to a pair of corresponding nodes (N1 and N2). A third amplifier (A3) in the output stage has a control electrode coupled to one of the nodes, a flow electrode coupled to the other node, and another flow electrode coupled to a further node (N3). A current supply (24) provides current at the further node. A charge/discharge element (CD1) produces a capacitive-type charge/discharge action between the further node and a source of a reference voltage ($V_{R1}$). The output stage may also include a fourth amplifier (A4), another current supply (26), and another such charge/discharge element (CD2) arranged in a complementary manner to the three preceding components.

23 Claims, 5 Drawing Sheets

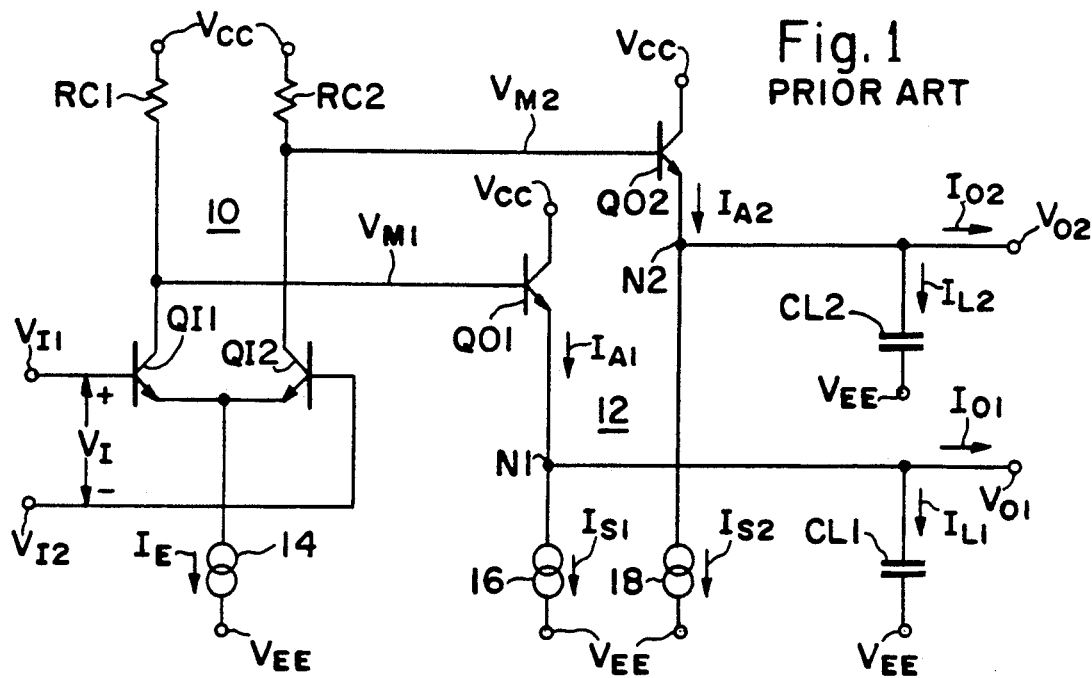
Fig. 1 PRIOR ART
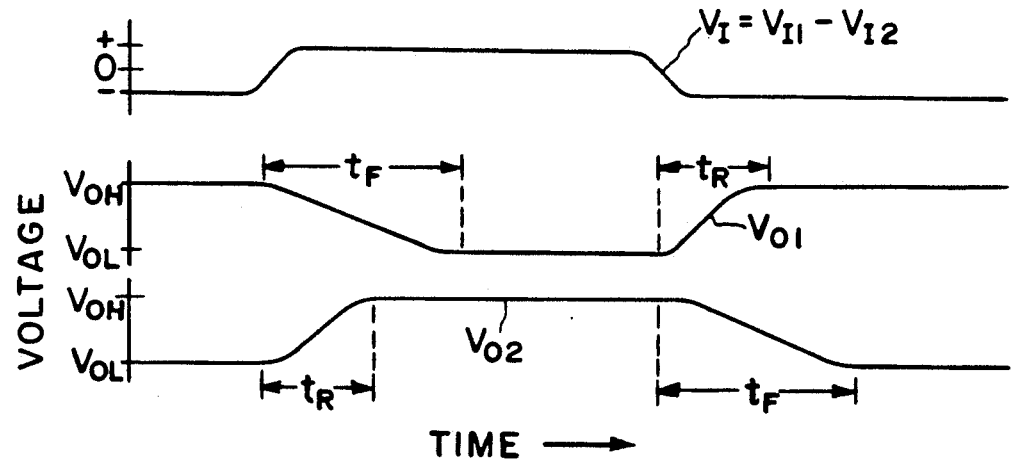
Fig. 2 PRIOR ART
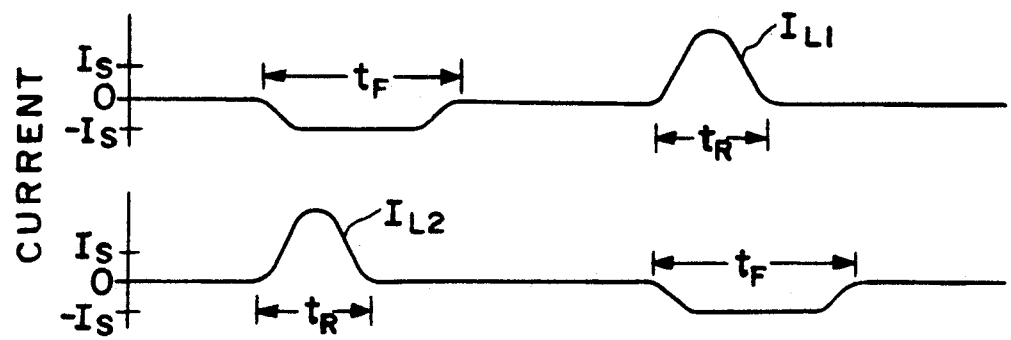

ELECTRONIC CIRCUIT WITH CAPACITIVELY ENHANCED SWITCHING

FIELD OF USE

This invention relates to switching circuits suitable for semiconductor integrated circuit applications.

BACKGROUND ART

Use of a differential configuration, as in emitter-coupled logic (ECL), typically enables an electronic circuit to switch very fast. Referring to the drawings, FIG. 1 illustrates a conventional ECL gate that switches between a pair of binary logic states. The gate operates in response to a differential input voltage signal $V_I$ formed by the difference $V_{I1}-V_{I2}$ between a pair of input voltages $V_{I1}$ and $V_{I2}$, one of which may be a substantially fixed reference voltage. Responsive to differential input $V_I$, the gate produces a pair of complementary output voltage signals $V_{O1}$ and $V_{O2}$ whose relative values characterize the gate's condition. The gate consists of a differential input stage 10 and an output stage 12.

Input stage 10 centers around a pair of largely identical differentially configured NPN input transistors QI1 and QI2 whose bases receive input voltages $V_{I1}$ and $V_{I2}$. A substantially constant current source 14 connected to a source of a low supply voltage $V_{EE}$ provides a supply current $I_E$ to the interconnected emitters of transistors QI1 and QI2. Their collectors are coupled through equal-value resistors RC1 and RC2 to a source of a high supply voltage $V_{cc}$. Complementary intermediate voltage signals $V_{M1}$ and $V_{M2}$ are supplied from the QI1 and QI2 collectors as outputs of stage 10.

Turning to output stage 12, it contains largely identical NPN output transistors QO1 and QO2 whose bases receive intermediate voltages $V_{M1}$ and $V_{M2}$. The collectors of transistors QO1 and QO2 are tied to the $V_{cc}$ supply. Their emitters carry currents $I_{A1}$ and $I_{A2}$. The QO1 and QO2 emitters are connected to nodes N1 and N2 from which output voltages $V_{O1}$ and $V_{O2}$ are taken. Output currents $I_{O1}$ and $I_{O2}$ flow out of the $V_{O1}$ and $V_{O2}$ output terminals. Largely identical substantially constant current sources 16 and 18, which are connected to the $V_{EE}$ supply, provide supply currents $I_{S1}$ and $I_{S2}$ at nodes N1 and N2.

The gate in FIG. 1 drives a parasitic load capacitance represented by capacitors CL1 and CL2. Capacitor CL1 is connected between node N1 and the $V_{EE}$ supply. Capacitor CL2 is similarly connected between node N2 and the $V_{EE}$ supply. Capacitive load currents $I_{L1}$ and $I_{L2}$ flow into (the upper plates of) capacitors CL1 and CL2.

The gate switches from one binary state to the other as differential input $V_I$ goes from a voltage less than $-60$ millivolts to a voltage greater than 60 millivolts, and vice versa. A better understanding of the switching operation is facilitated with the assistance of the waveforms shown in FIG. 2. Supply currents $I_{S1}$ and $I_{S2}$ have largely the same value during normal operation (since current sources 16 and 18 are largely identical). This value is represented by the symbol "$I_s$" in FIG. 2.

Assume $V_I$ is initially somewhat less than $-60$ millivolts as denoted by the "$-$" sign in FIG. 2. Transistor QI1 is non-conductive. $V_{M1}$ (not shown in FIG. 2) is at a high voltage $V_{MH}$ very close to $V_{cc}$. Transistor QI2 is fully turned on and draws current $I_E$ through resistor RC2. $V_{M2}$ (also not shown in FIG. 2) is at a low voltage $V_{ML}$.

Transistors QO1 and QO2 are both turned on. $V_{O1}$ is at a high voltage $V_{OH}$ that is approximately $1V_{BE}$ below $V_{MH}$. $V_{BE}$ is the magnitude of the standard voltage (approximately 0.8 volt) across the base-emitter junction of a bipolar transistor when it is fully conductive. Similarly, $V_{O2}$ is at a low voltage $V_{OL}$ approximately $1V_{BE}$ below $V_{ML}$. $I_{L1}$ and $I_{L2}$ are both zero. Capacitor CL1 is charged to a high level, while capacitor CL2 is charged to a low level.

When $V_I$ is raised to a value somewhat greater than 60 millivolts as denoted by the "$+$" sign in FIG. 2, transistor QI2 turns off. Transistor QI1 turns on and draws current $I_E$ through resistor RC1. $V_{M1}$ is thus pulled down to $V_{ML}$, causing transistor QO1 to become temporarily less conductive. $V_{O1}$ drops down to $V_{OL}$ during a fall time $t_F$, after which transistor QO1 returns to its initial conductive level.

The mechanism by which $V_{O1}$ is reduced to $V_{OL}$ involves discharging capacitor CL1 to a suitably low level. Capacitor CL1 discharges primarily through current source 16. Very little of the CL1 discharge occurs through the $V_{O1}$ output terminal, $I_{O1}$ typically consisting of the small current flowing into the base of an input transistor in a gate driven by the gate shown in FIG. 1. Consequently, the value that $I_{L1}$ can reach during the switching transition is largely limited by the value of $I_{S1}$. In particular, the maximum magnitude of $I_{L1}$ is largely equal to $I_S$ during the transition, as indicated in the left half of FIG. 2.

As $V_{M1}$ drops down to $V_{ML}$, $V_{M2}$ is pulled up to $V_{MH}$. Transistor QO2 pulls $V_{O2}$ up to $V_{OH}$ during a rise time $t_R$. More specifically, transistor QO2 temporarily becomes more conductive during time $t_R$. The resulting increase in $I_{A2}$ enables $I_{L2}$ to increase temporarily in the manner depicted in the left half of FIG. 2. Capacitor CL2 is thereby charged to a high level.

The amount that $I_{A2}$ can increase during the switching transition is normally considerably greater than $I_S$. $I_{L2}$ thus reaches a value substantially greater than $I_S$ and, accordingly, much greater than $I_{L1}$. Higher charge/discharge current means shorter rise/fall time. As a result, $t_R$ is significantly less than $t_F$.

The reverse events occur when $V_I$ is returned to a value less than $-60$ millivolts. See the right half of FIG. 2 where $t_R$ now represents the rise time for $V_{O1}$, and $t_F$ represents the fall time for $V_{O2}$. Again, $t_R$ is significantly less than $t_F$. For the reasons given above, the minimum value of $t_F$ is limited by the value of $I_S$. The switching speed of the gate in FIG. 1 is thus limited by supply current $I_S$.

Making current sources 16 and 18 larger—i.e., increasing $I_S$—is disadvantageous because the steady-state current requirements of the gate increase proportionately. A commensurate increase in power dissipation occurs. It is desirable to increase the switching speed of an ECL gate of the type shown in FIG. 1 without drawing any significant additional steady-state current.

GENERAL DISCLOSURE OF THE INVENTION

The present invention is an electronic switching circuit capable of achieving the foregoing objective. In particular, the invention employs capacitively enhanced switching to obtain high switching speed without significantly increasing steady-state current needs. The invention is especially useful in ECL.

The present circuit contains an input stage and an output stage. The input stage operates in response to at least one input signal to produce largely complementary first and second intermediate signals. The output stage centers around a pair of three-electrode amplifiers referred to as the first and second amplifiers. The first amplifier has a first flow electrode coupled to a first node from which a first output signal can be taken, a second flow electrode, and a control electrode responsive to the first intermediate signal for controlling current transmission between the first amplifier's flow electrodes. The second amplifier has a first flow electrode coupled to a second node, a second flow electrode, and a control electrode responsive to the second intermediate signal for controlling current transmission between the second amplifier's flow electrodes.

In one version of the invention, the output stage further includes a third three-electrode amplifier, a first current supply, and a first charge/discharge element. The third amplifier has a first flow electrode coupled to a third node, a second flow electrode coupled to the first node, and a control electrode coupled to the second node for controlling current transmission between the third amplifier's flow electrodes. The first current supply provides supply current at the third node. The first charge/discharge element produces a capacitive-type charge/discharge action between the third node and a source of a first reference voltage. This version of the invention also usually includes a second current supply that provides supply current at the second node.

If the first and second amplifiers and the first and second current supplies are respectively analogized to output transistors QO1 and QO2 and current sources 1 6 and 18 in the prior art ECL gate described above, this version of the invention operates basically the same as the prior art gate except that additional current flows into the first charge/discharge element when the voltage of the output signal drops. The additional current helps to discharge the output capacitance associated with the load to which the output signal is applied. In effect, the additional current increases the value of the current provided by the first current supply during the time that the voltage of the output signal is falling. This reduces the fall time, thereby increasing the switching speed of the circuit. The third amplifier causes the charge/discharge element to function in the preceding manner.

The amount of charge that flows into the charge/discharge element during the fall time is largely equal to the amount of charge that flows out of the charge/discharge element during the subsequent time in which the voltage of the output signal returns to its initial level. The third amplifier requires very little (if any) current to keep it in the desired operational condition. As a consequence, the charge/discharge element and the third amplifier do not draw any significant additional steady-state current.

In another version of the invention, the output stage includes a fourth three-electrode amplifier and a second charge/discharge element in addition to the previously mentioned components. The fourth amplifier has a first flow electrode coupled to a fourth node, a second flow electrode coupled to the second node from which a second output signal can be taken, and a control electrode coupled to the first node for controlling current transmission between the fourth amplifier's flow electrodes. The second charge/discharge element provides a capacitive-type charge/discharge action between the fourth node and a source of a second reference voltage. The second current supply provides supply current at the fourth node (rather than at the second node) in this version of the invention.

The first charge/discharge element and the third amplifier in the second version of the present circuit speed up the switching of the first output signal in basically the same way as in the first version. Importantly, the second charge/discharge element and the fourth amplifier provide a complementary action that similarly speeds u the switching of the second output signal without significantly increasing the steady-state current requirements of the circuit. In short, the circuit switches faster without dissipating more power.

BRIEF DESCRIPTION OF THE DRAWINGS

FIG. I is a circuit diagram of a prior art ECL gate.

FIG. 2 is a graph of certain voltage and current waveforms as a function of time for the gate in FIG. 1.

Like reference symbols are employed in the drawings and in the description of the preferred embodiments to represent the same or very similar item or items.

DESCRIPTION OF THE PREFERRED EMBODIMENTS

The invention employs various three-electrode amplifiers identified by reference symbols beginning with the letter "A". Each such "A" amplifier has a first flow electrode (1E), a second flow electrode (2E), and a control electrode (CE) for controlling current flow between the flow electrodes (1E and 2E). Charge carriers, either electrons or holes, that move between the flow electrodes of each "A" amplifier originate at its first flow electrode and terminate at its second flow electrode. Current flow begins when the voltage between the control electrode and the first flow electrode passes a specified threshold level. The current (if any) flowing in the control electrode is much smaller than that otherwise moving between the flow electrodes.

Each "A" amplifier preferably consists of a single transistor. In the case of a bipolar transistor, its emitter, collector, and base are respectively the first, second, and control electrodes. These elements are respectively the source, drain, and gate for a field-effect transistor of either the insulated-gate or junction type.

In some cases, each "A" amplifier could consist of more than one transistor. One example is a bipolar Darlington circuit in which the emitter of an input transistor is connected to the base of a trailing transistor. In this case, the control electrode of the "A" amplifier is (connected to) the base of the input transistor, while the first and second control electrodes are respectively (connected to) the emitter and collector of the trailing transistor.

As used in describing two (or more) of the "A" amplifiers, "like configured" or "configured the same" means that the amplifiers have corresponding elements interconnected in the same way and that each set of corresponding elements is of the same semiconductor polarity. For example, two of the "A" amplifiers are like configured if both are NPN transistors but not if one is an NPN transistor while the other is a PNP transistor. Likewise, Darlington circuits are like configured as long as the input transistors are of the same polarity and the trailing transistors are of the same polarity (even if different from that of the input transistors).

Figure 3:
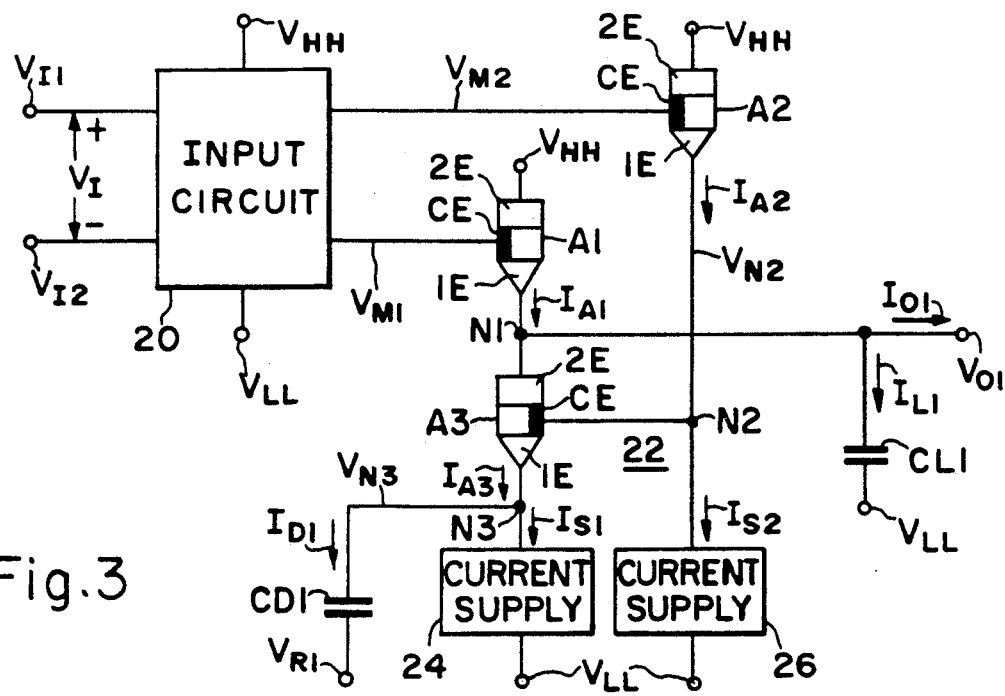
FIGS. 3 and 5 are block/circuit diagrams of two general electronic circuits in accordance with the invention.

FIG. 3 illustrates a general implementation of a "single-ended" version of a switching circuit arranged according to the teachings of the invention. This circuit produces (single) output voltage signal $V_{O1}$ in response to input voltage signal $V_I$ consisting of the difference between input voltages $V_{I1}$ and $V_{I2}$. The circuit is formed with an input stage 20 and an output stage 22, both connected between sources of a low supply voltage $V_{LL}$ and a high supply voltage $V_{HH}$.

Input stage 20 produces complementary intermediate voltage signals $V_{M1}$ and $V_{M2}$ in response to differential input $V_I$. Voltages $V_{M1}$ and $V_{M2}$ switch between high and low levels that are again denoted as $V_{MH}$ and $V_{ML}$ even though their actual values may differ from those indicated above for the ECL gate in FIG. 1.

Output stage 22 contains like-configured amplifiers A1 and A2 whose control electrodes receive voltages $V_{M1}$ and $V_{M2}$. The first electrodes of amplifiers A1 and A2 supply currents $I_{A1}$ and $I_{A2}$ to nodes N1 and N2. The A1 and A2 second electrodes are both tied to the $V_{HH}$ supply.

The remaining components of output stage 22 consist of an amplifier A3, a discharge capacitor CD1, and current supplies 24 and 26. Amplifier A3, which is preferably configured the same as amplifiers A1 and A2, has its control and second electrodes respectively connected to nodes N2 and N1. Its first electrode provides a current $I_{A3}$ to a node N3. Discharge capacitor CD1 is connected between node N3 and a source of a reference voltage $V_{R1}$. A current $I_{D1}$ flows from node N3 into (the upper plate of) capacitor CD1. Current supply 24 is connected between the $V_{LL}$ supply and node N3. Current supply 26 is connected between the $V_{LL}$ supply and node N2. Supplies 24 and 26 provide supply currents $I_{S1}$ and $I_{S2}$ to nodes N3 and N2 at which voltages $V_{N3}$ and $V_{N2}$ are present.

Output voltage $V_{O1}$ is taken from node N1. Output current $I_{O1}$ again flows out of the $V_{O1}$ terminal. The circuit in FIG. 3 drives a parasitic load capacitance represented by capacitor CL1 connected between node N1 and the $V_{LL}$ supply. Current $I_{L1}$ again flows into capacitor CL1.

Figure 4:
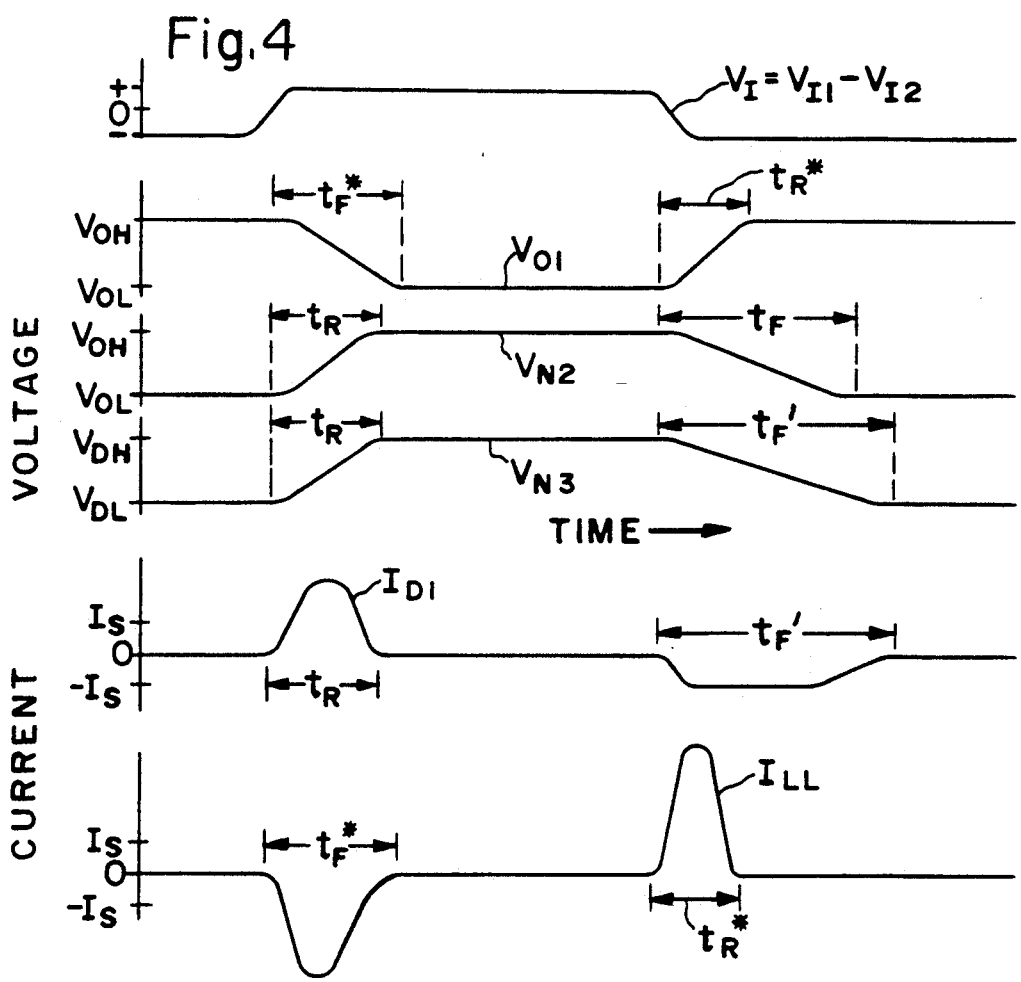
FIGS. 4 and 6 are graphs of certain voltage and current waveforms as a function of time for the respective circuits in FIGS. 3 and 5.

FIG. 4 shows waveforms useful in understanding how the circuit in FIG. 3 functions. The waveforms in FIG. 4 illustrate the specific example in which currents $I_{S1}$ and $I_{S2}$ are both constant and equal to the same value $I_S$. FIG. 4 also represents the example in which $V_I$ is initially at a sufficiently low value, as denoted by the "—" sign, that $V_{M1}$ (not shown in FIG. 4) is at high level $V_{MH}$. $V_{M2}$ (likewise not shown in FIG. 4) is initially at low level $V_{ML}$.

Amplifiers A1–A3 are all turned on and operate in approximately a unity-gain mode. A defined offset voltage exists between the control and first electrodes of each of amplifiers A1–A3. $V_{O1}$ is thereby at a high level, represented as $V_{OH}$, that is a specified amount below $V_{MH}$. $V_{N2}$ is at a low level, represented as $V_{OL}$, that is largely the same amount below $V_{ML}$. A relatively large voltage drop occurs across amplifier A3—i.e., between its first and second electrodes. Consequently, $V_{N3}$ is initially at a low level $V_{DL}$ as indicated in the left half of FIG. 4.

$I_{A3}$ initially equals $I_S$. $I_{D1}$ and $I_{L1}$ are both zero. Capacitor CL1 is charged to a high level. Capacitor CD1 is charged to a low level.

The circuit in FIG. 3 is switched by raising $V_I$ to a value that is sufficiently high, as represented by the "+" sign in FIG. 4, to bring $V_{M1}$ down to $V_{ML}$. Amplifier A1 temporarily becomes less conductive and reduces current $I_{A1}$ supplied to node N1. $V_{M2}$ rises up to $V_{MH}$. Amplifier A2 temporarily becomes more conductive and pulls $V_{N2}$ up to $V_{OH}$ in rise time $t_R$. The increase in $V_{N2}$ causes amplifier A3 to become temporarily more conductive. $V_{N3}$ is similarly pulled up to a high level $V_{DH}$ in a time largely equal to $t_R$. Again, see the left half of FIG. 4.

As $V_{N3}$ increases, capacitor CD1 charges through amplifier A3 to a high level. $I_{D1}$ temporarily increases in the manner generally shown in the left half of FIG. 4, causing $I_{A3}$ to increase temporarily in the same way. The presence of capacitor CD1 thereby enables $I_{A3}$ to increase temporarily to a value considerably higher than $I_S$.

The increase in the conductivity of amplifier A3 causes the voltage across it to decrease. This allows $V_{O1}$ to decrease. Capacitor CO1 discharges to a low level. The discharge of capacitor CO1 occurs primarily through amplifier A3 and, thus, through capacitor CD1 and current supply 24. Because usage of capacitor CD1 allows $I_{A3}$ to rise considerably above $I_S$, the magnitude of $I_{L1}$ is not limited by current supply 24 and thereby temporarily reaches a value considerably greater than $I_S$. See the left half of FIG. 4. The result is that capacitor CL1 discharges more rapidly than what would occur if capacitor CD1 were absent. Accordingly, $V_{O1}$ drops to $V_{OL}$ in a substantially reduced fall time $t_F^*$.

The opposite events basically occur when $V_I$ is returned to the low ("—") value except that the charge/discharge paths for capacitors CD1 and CL1 are different. Capacitor CD1 discharges through current supply 24 to a low level. Capacitor CL1 charges through amplifier A1 to a high level. Amplifier A1 conducts considerably more current than supply 24. Consequently, $V_{O1}$ rises up to $V_{OH}$ in a rise time $t_R^*$ as indicated in the right half of FIG. 4. Because supply 24 is used in discharging capacitor CD1, $t_R^*$ is typically slightly less than $t_R$.

As to capacitor CD1, the maximum magnitude of $I_{D1}$ is equal to $I_S$ during the second switching transition. See the right half of FIG. 4. $V_{N3}$ thereby drops to $V_{DL}$ in a relatively long fall time $t_F'$. $V_{N2}$ similarly drops to $V_{OL}$ in fall time $t_F$ which, although typically somewhat less than $t_F'$, is still relatively large. However, $t_F^*$ is the parameter that limits the circuit switching speed. Since $t_F^*$ is quite small, the relatively high values for $t_F$ and $t_F'$ do not cause a problem at normal circuit switching frequencies.

Importantly, the amount of charge that flows into capacator CD1 during a switching transition in one direction largely equals the amount of charge that flows out of capacitor CD1 during a switching transition in the opposite direction. That is, the area "under" the $I_{D1}$ curve in the left half of FIG. 4 is largely equal to the area "under" the $I_{D1}$ curve in the right half of FIG. 4. Amplifier A3 draws little current. Accordingly, amplifier A3 and capacitor CD1 do not draw any significant steady-state current.

Figure 5:
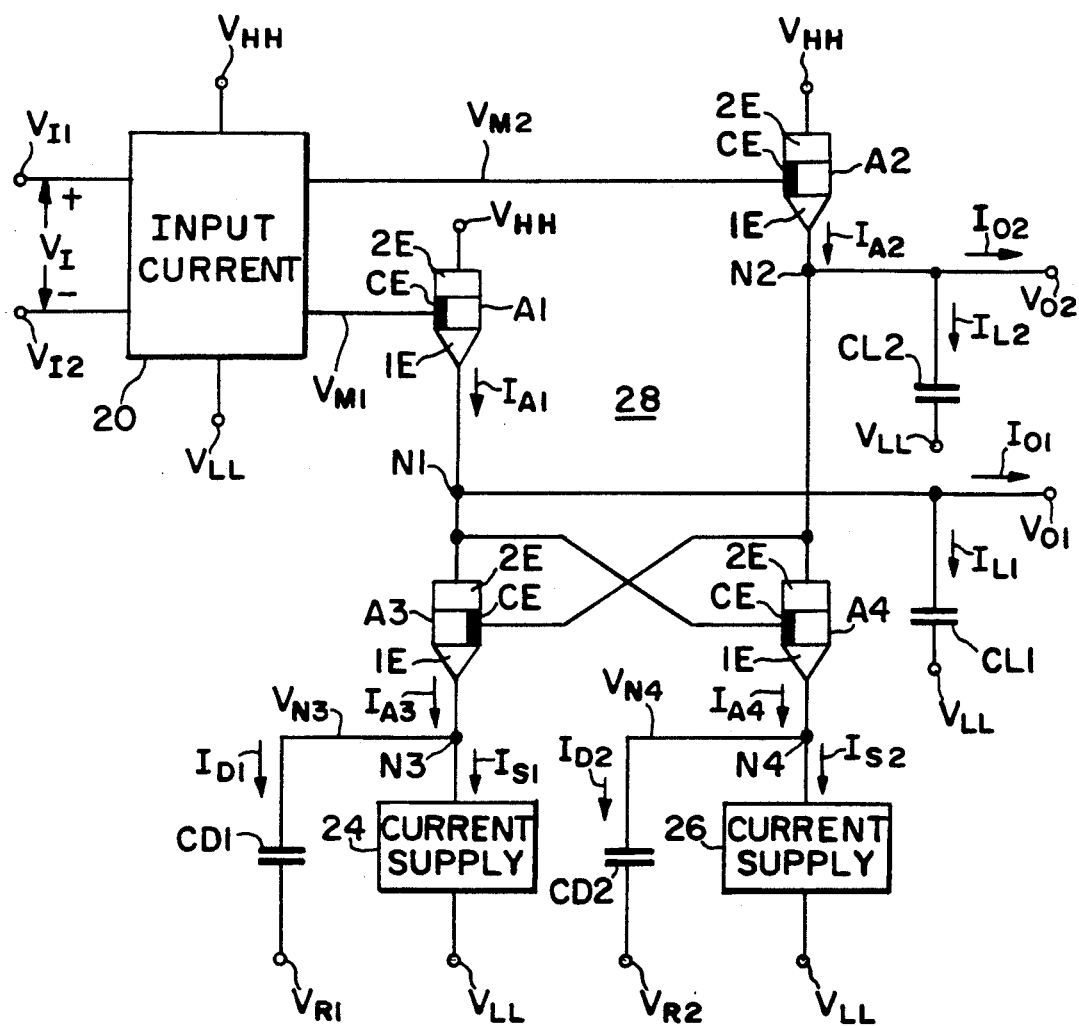

Moving to FIG. 5, it shows a general implementation of a "double-ended" version of a switching circuit in accordance with the invention. The circuit in FIG. 5 produces complementary output voltage signals $V_{O1}$ and $V_{O2}$ in response to differential input voltage signal $V_I$. The circuit consists of input stage 20, as described above for FIG. 3, and an output stage 28 connected between the $V_{LL}$ and $V_{HH}$ supplies.

Output stage 28 is formed with like-configured amplifiers A1 and A2, like-configured cross-coupled amplifiers A3 and A4, discharge capacitors CD1 and CD2, and current supplies 24 and 26. Amplifiers A3 and A4 are preferably configured the same as amplifiers A1 and A2. Components A1–A3, CD1, and 24 are interconnected the same as in FIG. 3.

Amplifier A4 has its control and second electrodes respectively connected to nodes N1 and N2. Its first electrode provides a current IA4 to a node N4. Capacitor CD2 is connected between node N4 and a source of a reference Voltage VR2. A current $I_{D2}$ flows from node N4 into (the upper plate of) capacitor $C_{D2}$. Current supply 26 is here connected between the $V_{LL}$ supply and node N4. Supply 26 provides supply current $I_{S2}$ to node N4 at which a voltage $V_{N4}$ is present.

Output voltage $V_{O1}$, output current $I_{O1}$, and capacitor current $I_{L1}$ exist or are located at the same places as in FIG. 3. Output voltage $V_{O2}$ is taken from node N2. Output current $I_{O2}$ again flows out of the $V_{O2}$ terminal. In addition to driving the load capacitance represented by capacitor CL1, the circuit in FIG. 5 drives a parasitic load capacitance represented by capacitor CL2 connected between node N2 and the $V_{LL}$ supply. Current $I_{L2}$ again flows into capacitor CL2.

Figure 6:
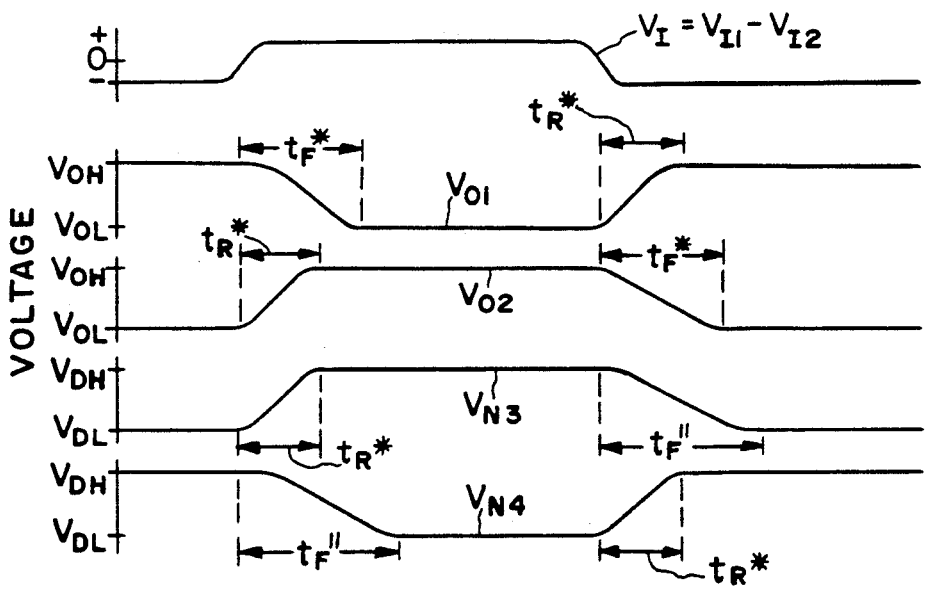
Figure 6:
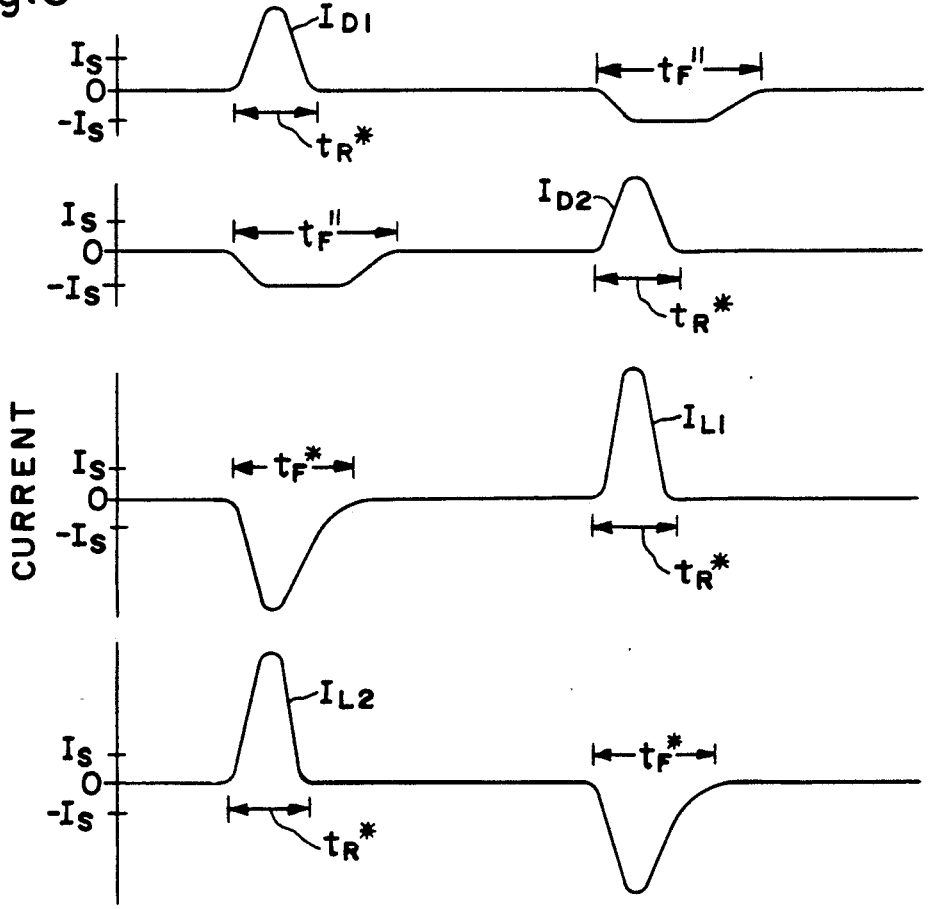

FIG. 6 shows waveforms that illustrate how the circuit in FIG. 5 typically functions. All the definitions and initial conditions given above in explaining the operation of the circuit in FIG. 3 apply to the circuit in FIG. 5. $V_{O2}$, which basically replaces $V_{N2}$ in FIGS. 3 and 4, is initially at $V_{OL}$. Amplifier A4 is conductive and operates in approximately a unity-gain fashion with a defined offset voltage between its control and first electrodes. A relatively small voltage drop exists across amplifier A4—i.e., between its flow electrodes. Consequently, $V_{N4}$ is initially at high level $V_{DH}$ as shown in the left half of FIG. 6.

As with $I_{A3}$, $I_{A4}$ is initially equal to $I_S$. Capacitor CL2 is charged to a low level, just the opposite of capacitor CL1. Similarly, capacitor CD2 is charged to a high level, just the opposite of capacitor CD1. $I_{D2}$ and $I_{L2}$ are both equal to zero along with $I_{D1}$ and $I_{L1}$.

Raising $V_I$ to the "+" level causes the circuit in FIG. 5 to switch. Elements A1–A3, CD1, and CL1 go through substantially the same changes described above for FIG. 3. Compare FIGS. 4 and 6. Capacitor CL1 thereby discharges substantially faster than it would discharge if capacitor CD1 were absent. As indicated in the left half of FIG. 6, this enables $V_{O1}$ to drop down to $V_{OL}$ in reduced fall time $t_F^*$.

The decrease in $V_{O1}$ causes amplifier A4 to become temporarily less conductive. The increased resistance across amplifier A4 forces $V_{N4}$ to drop down to $B_{DL}$. Capacitor CD2 discharges through current supply 26. During the switching transition, $V_{O2}$ rises to $V_{OH}$ as capacitor CL2 charges through amplifier A2 to a high level. Amplifier A2 conducts considerably more current than supply 26. Accordingly, $V_{O2}$ reaches $V_{OH}$ in slightly shortened rise time $t_R^*$.

$V_{N3}$ follows $V_{O2}$ upward and also substantially reaches $V_{DH}$ in time $t_R^*$. Because the maximum magnitude of $I_{D2}$ is limited to $I_S$ as shown in the left half of FIG. 6, $V_{N4}$ takes a relatively long time $t_F''$ to fall to $V_{DL}$. However, the elevated value for $t_F''$ is not a problem at normal circuit frequencies since $t_F^*$ (the parameter which limits the circuit switching speed) is quite small.

Complementary events to those described above occur when $V_I$ is returned to the "−" level. That is, elements A2, A4, 26, CL2, and CD2 go through the same respective actions as elements A1, A3, 24, CL1, and CD1, and vice versa. As indicated in the right half of FIG. 6, $V_{O2}$ thereby drops down to $V_{OL}$ in substantially reduced fall time $t_F^*$. $V_{O1}$ goes up to $V_{OH}$ in slightly shortened rise time $t_R^*$.

As with the circuit of FIG. 3, the amount of charge that flows into capacitor CD1 during one switching transition is largely equal to the amount of charge that flows out of capacitor CD1 during the next switching transition. Similarily, the amount of charge that flows out of capacitor CD2 during one switching transition is largely equal to the amount of charge that flows into capacitor CD2 during the following transition. Components A3, A4, CD1, and CD2 thus improve the switching speed without significantly raising the steady-state current requirements for the circuit.

In the preceding operational examples for the circuits of FIGS. 3 and 5, it was assumed that supply currents $I_{S1}$ and, in the case of FIG. 5, $I_{S2}$ are fixed—i.e., supplies 24 and 26 are constant current sources. Nonetheless, qualitatively the same action occurs if $I_{S1}$ and $I_{S2}$ vary in a conventional manner—e.g., each of supplies 24 and 26 is implemented with a resistor. The charge exchanged between capacitors CL1 and CD1 and, in the case of FIG. 5, between capacitors CL2 and CD2, enables the circuits to switch faster without drawing significant additional steady-state current.

Figure 7:
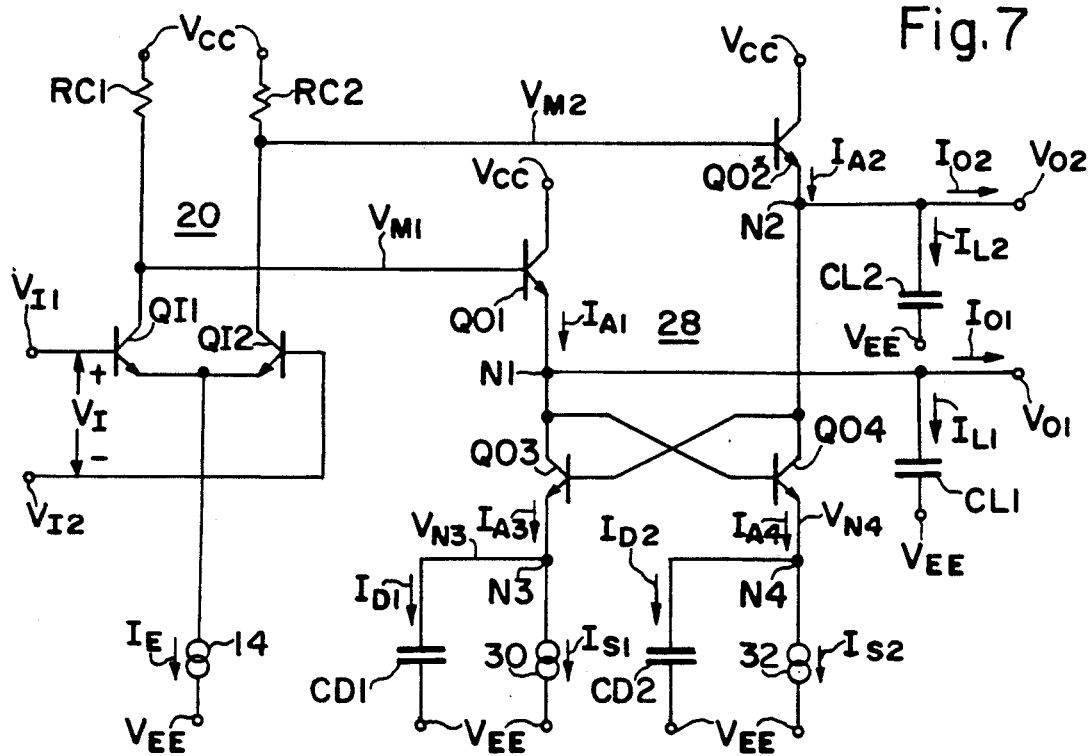
FIGS. 7 and 8 are circuit diagrams for ECL implementations of the gate in FIG. 5.

FIG. 7 illustrates a general ECL embodiment of the circuit in FIG. 5. $V_{HH}$ and $V_{LL}$ in FIG. 5 correspond respectively to $V_{CC}$ and $V_{EE}$ in this embodiment. Reference voltages $V_{R1}$ and $V_{R2}$ are both $V_{EE}$ here.

Input stage 20 is implemented in FIG. 7 with NPN input transistors QI1 and QI2, collector resistors RC1 and RC2, and substantially constant current source 14 arranged the same as in input stage 10 of FIG. 1. Amplifiers A1 and A2 in FIG. 5 are embodied here with NPN output transistors QO1 and QO2 as in FIG. 1. Amplifiers A3 and A4 are implemented with largely identical NPN transistors QO3 and QO4 in FIG. 7. Capacitors CD1 and CD2 are substantially equal in value. Finally, supplies 24 and 26 are respectively embodied here with largely identical substantially constant current sources 30 and 32.

Input stage 20 in FIG. 7 operates in the manner described above for input stage 10 in FIG. 1. Output stage 28 in FIG. 7 operates in the particular way described above for FIG. 5 as illustrated in FIG. 6.

Figure 8:
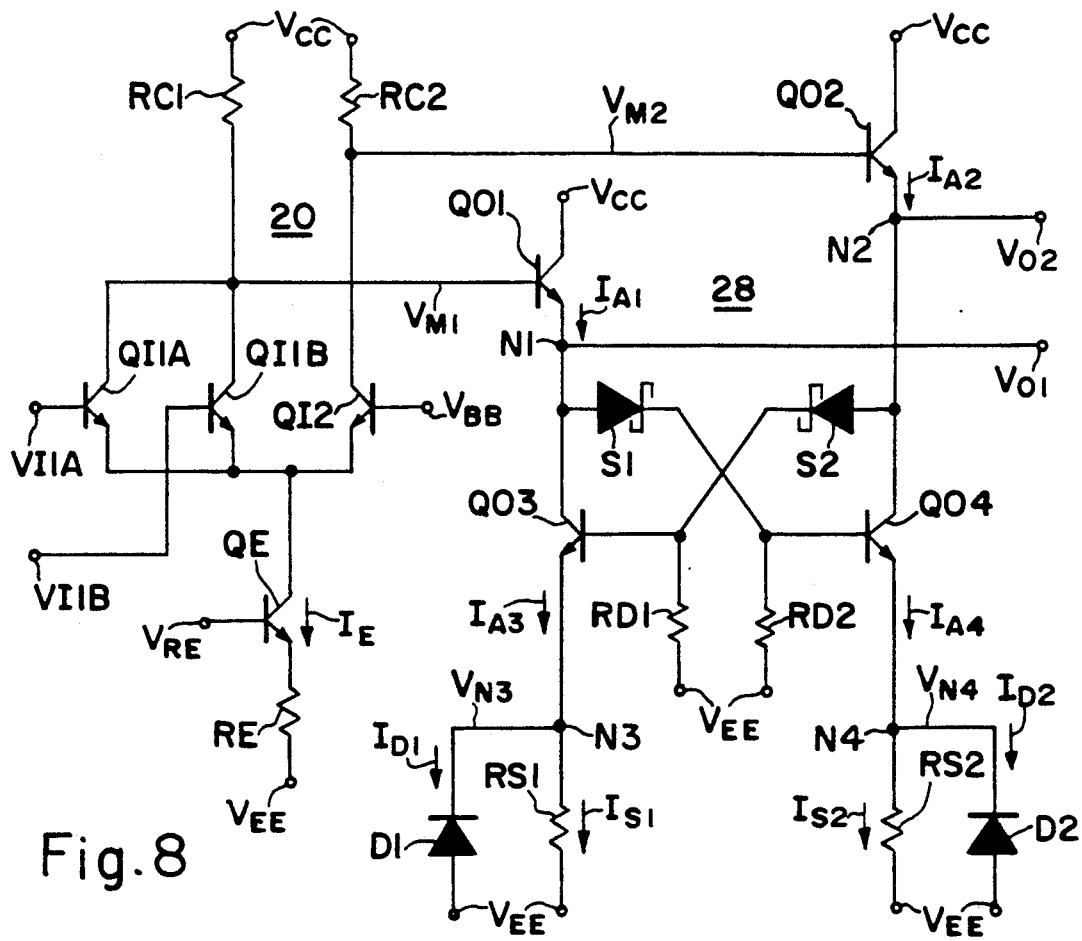

Turning to FIG. 8, it depicts a preferred two-input NOR gate ECL implementation (or extension) of the circuit in FIG. 5. Many of the specific elements and parameters in FIG. 8 are the same as in FIG. 7. The correspondence between these specific items and the more general items in FIG. 5 is self-evident and, accordingly, is not discussed further here. Only the areas in which FIG. 8 goes into more detail than, or differs from, FIG. 5 are discussed below.

Input stage 20 in FIG. 8 contains largely identical NPN input transistors QI1A and QIAB, each of which corresponds to input transistor Q1 in FIG. 7. The QI1A and QI1B bases receive input voltages $V_{I1A}$ and $V_{I1B}$, each of which corresponds to $V_{I1}$. $V_{BB}$ in FIG. 8 is a substantially fixed reference voltage that corresponds to $V_{f2}$ in FIG. 7. Current source 14 is implemented with an NPN transistor QE and a resistor RE arranged as shown. The QE base receives a substantially constant reference voltage $V_{RE}$.

Input stage 20 in FIG. 8 operates in a conventional way. When $V_{f1A}$ and $V_{f2A}$ are both at least 60 millivolts below $V_{BB}$, transistor QI2 is turned on and draws all of current $I_E$ through resistor RC2. $V_{M2}$ is at $V_{ML}$, while $V_{M1}$ is at $V_{MH}$. If one or both of $V_{f1A}$ and $V_{f1B}$ is raised to a value at least 60 millivolts higher than $V_{BB}$, transistor QI2 turns off. $V_{M1}$ and $V_{M2}$ switch values.

In output stage 28 of FIG. 8, capacitors CD1 and CD2 are respectively implemented with PN diodes D1 and D2 whose anodes are connected to the $V_{EE}$ supply. Diodes D1 and D2 are thus reverse biased during normal circuit operation. Supplies 24 and 26 are respectively formed with equal-value current-supply resistors RS1 and RS2 in FIG. 8. Stage 28 here operates in the manner described above except that resistors RS1 and RS2 cause $I_{S1}$ and $I_{S2}$ to vary linearly with $V_{N3}$ and $V_{N4}$.

Output stage 28 in FIG. 8 also contains Schottky diodes S1 and S2 and equal-value discharge resistors RD1 and RD2 connected as shown. Diodes S1 and S2 permit larger voltage swings to occur in $V_{O1}$ and $V_{O2}$ while preventing the QO3 and QO4 collector-to-emitter voltages from dropping to unacceptably low values. Resistors RD1 and RD2 help to discharge the QO3 and QO4 bases so as to speed up the switching of transistors QO3 and QO4.

In the preferred embodiment of FIG. 8, $V_{CC}$ and $V_{EE}$ are 0 and $-4.5$ volts, respectively. $V_{BB}$ and $V_{RE}$ are $-1.3$ and $-3.2$ volts, respectively. Resistors RE, RC1/RC2, RS1/RS2, and RD1/RD2 are 800, 1,600, 8,000 and 30,000 ohms, respectively. Capacitors CD1 and CD2 are each approximately 200 femtofarads. Capacitors CL1 and CL2 are each typically approximately 200 femtofarads. The circuit is formed as part of a monolithic semiconductor integrated circuit.

While the invention has been described with reference to particular embodiments, this description is solely for the purpose of illustration and is not to be construed as limiting the scope of the invention claimed below. For example, the circuit in FIG. 3 could be implemented using the circuit element shown in FIG. 7 or 8. Various changes and modifications may thus be made by those skilled in the art without departing from the true scope and spirit of the invention as defined in the appended claims.

I claim:

1. An electronic switching circuit comprising (a) input means responsive to at least one input signal for producing largely complementary first and second intermediate signals and (b) output means that comprises:
   a first amplifier having a first flow electrode coupled to a first node, a second flow electrode, and a control electrode responsive to the first intermediate signal for controlling current transmission between the first amplifier's flow electrodes, a bias supply connected commonly to the second flow electrodes of the first and second amplifiers;
   a second amplifier having a first flow electrode coupled to a second node, a second flow electrode, and a control electrode responsive to the second intermediate signal for controlling current transmission between the second amplifier's flow electrodes, a bias supply connected commonly to the second flow electrodes of the first and second amplifiers;
   a third amplifier having a first flow electrode coupled to a third node, a second flow electrode coupled to the first node, and a control electrode coupled to the second node for controlling current transmission between the third amplifier's flow electrodes;
   first current-supply means for providing supply current at the third node; and
   first charge/discharge means for providing a capacitive-type charge/discharge action between the third node and a source of a first reference voltage.

2. A circuit as in claim 1 wherein the output means includes second current-supply means for providing supply current at the second node.

3. A circuit as in claim 2 wherein each amplifier comprises a bipolar transistor having an emitter, a collector, and a base respectively coupled to the first, second, and control electrodes of that amplifier, the transistors being of like 4. A circuit as in claim 2 wherein a first output signal is available at the first node, the voltage of the first output signal largely following the voltage of the first intermediate signal.

5. A circuit as in claim 2 wherein the first and second amplifiers are like configured.

6. A circuit as in claim 5 wherein the third amplifier is configured the same as the first and second amplifiers.

7. A circuit as in claim 5 wherein each amplifier comprises a transistor.

8. A circuit as in claim 5 wherein the first charge/discharge means comprises a capacitor coupled between the third node and the source of the first reference voltage.

9. A circuit as in claim 8 wherein the first current-supply means comprises a current source coupled between the third node and a source of a first supply voltage.

10. A circuit as in claim 9 wherein the first reference voltage is substantially equal to the first supply voltage, the capacitor being a reverse-biased diode.

11. A circuit as in claim 8 wherein the first current-supply means comprises a resistor coupled between the third node and a source of a first supply voltage.

12. A circuit as in claim 11 wherein the first reference voltage is substantially equal to the first supply voltage, the capacitor being a reverse-biased diode.

13. A circuit as in claim 1 wherein the output means includes:
   a fourth amplifier having a first flow electrode coupled to a fourth node, a second flow electrode coupled to the second node, and a control electrode coupled to the first node for controlling current transmission between the fourth amplifier's flow electrodes;
   second current-supply means for providing supply current at the fourth node; and
   second charge/discharge means for providing a capacitive-type charge/discharge action between the fourth node and a source of a second reference voltage.

14. A circuit as in claim 13 wherein: the first and second amplifiers are like configured; and the third and fourth amplifiers are like configured.

15. A circuit as in claim 14 wherein each amplifier comprises a bipolar transistor having an emitter, a collector, and a base respectively coupled to the first, second, and control electrodes of that amplifier, the transistors being of like polarity.

16. A circuit as in claim 14 wherein first and second output signals are respectively available at the first and second nodes, the voltages of the first and second output signals respectively largely following the voltages of the first and second intermediate signals.

17. A circuit as in claim 14 wherein the third and fourth amplifiers are configured the same as the first and second amplifiers.

18. A circuit as in claim 14 wherein each amplifier comprises a transistor.

19. A circuit as in claim 14 wherein: the first charge/discharge means comprises a first capacitor coupled between the third node and the source of the first reference voltage; and the second charge/discharge means comprises a second capacitor coupled between the fourth node and the source of the second reference voltage.

20. A circuit as in claim 19 wherein: the first current-supply means comprises a current source coupled between the third node and a source of a first supply voltage; and the second current-supply means comprises a current source coupled between the fourth node and the source of the first supply voltage.

21. A circuit as in claim 20 wherein the first and second reference voltages are substantially equal to the first supply voltage, each capacitor being a reverse-biased diode.

22. A circuit as in claim 19 wherein: the first current-supply means comprises a resistor coupled between the third node and a source of a first supply voltage; and the second current-supply means comprises a resistor coupled between the fourth node and the source of the first supply voltage.

23. A circuit as in claim 22 wherein the first and second reference voltages are substantially equal to the first supply voltage, each capacitor being a reverse-biased diode.

* * * * *

UNITED STATES PATENT AND TRADEMARK OFFICE
CERTIFICATE OF CORRECTION

PATENT NO. : 5,087,837
DATED : February 11, 1992
INVENTOR(S) : RONALD L. CLINE

It is certified that error appears in the above-identified patent and that said Letters Patent is hereby corrected as shown below:

Claim 1, line 5, delete ",";
        lines 9 - 11, delete ", a bias supply connected commonly to the second flow electrodes of the first and second amplifiers".

Claim 3, line 5, after "like", insert "polarity.".

Signed and Sealed this

Twentieth Day of July, 1993

Attest:

MICHAEL K. KIRK

Attesting Officer     Acting Commissioner of Patents and Trademarks